United States Patent [19]

Yagi

[11] Patent Number: 5,710,785
[45] Date of Patent: Jan. 20, 1998

[54] SEQUENTIAL DECODER HAVING SHORT SYNCHRONIZATION RECOVERY TIME

[75] Inventor: Toshiharu Yagi, Tokyo, Japan

[73] Assignee: NEC Corporation, Tokyo, Japan

[21] Appl. No.: 428,795

[22] Filed: Apr. 24, 1995

Related U.S. Application Data

[63] Continuation of Ser. No. 737,547, Jul. 30, 1991, abandoned, which is a continuation-in-part of Ser. No. 229,416, Aug. 8, 1988, abandoned.

[30] Foreign Application Priority Data

Aug. 7, 1987 [JP] Japan .................................. 62-197682
Oct. 20, 1987 [JP] Japan .................................. 62-265643

[51] Int. Cl.⁶ .................................................. H03M 13/12
[52] U.S. Cl. ..................................................... 371/46
[58] Field of Search ............................. 371/43, 44, 45, 371/46

[56] References Cited

U.S. PATENT DOCUMENTS

| | | | |
|---|---|---|---|
| 3,665,396 | 5/1972 | Forney, Jr. | 371/49.1 |
| 4,539,684 | 9/1985 | Kloker | 371/46 |
| 4,710,746 | 12/1987 | Shimoda et al. | 371/43 X |

OTHER PUBLICATIONS

Fano, R., "A Heuristic Discussion of Probabilistic Decoding", *IEEE Transactions on Information Theory*, Apr. 1963, pp. 64–74.

Forney, Jr. et al., "A High-Speed Sequential Decoder: Prototype Design and Test", *IEEE Transactions on Communication Tech.*, vol. COM-19, No. 5, Oct. 1971, pp. 821–835.

*Primary Examiner*—Stephen M. Baker
*Attorney, Agent, or Firm*—Sughrue, Mion, Zinn, Macpeak & Seas, PLLC

[57] ABSTRACT

Convolutional code symbols are sequentially stored into a first buffer at a transmission rate and read therefrom into a decoder where the symbols are decoded at a rate higher than the transmission rate and stored into a second buffer. A controller determines the likelihood of each decoded symbol in accordance with a predetermined likelihood algorithm and causes the decoded symbols to be read out of the second buffer in a backward direction into the decoder when the determination indicates a low likelihood value. When the first buffer is overflowed, the controller causes symbols to be read out of the first buffer into the decoder staring with a symbol which is k symbols older than the most recently received symbol and causes the decoder to shift its symbol timing by one clock interval, where k is an integer ranging from zero to a predetermined number which is smaller than the maximum number of symbols that can be stored in the first buffer.

13 Claims, 6 Drawing Sheets

CONTROLLER 6

OVERFLOW

NORMAL

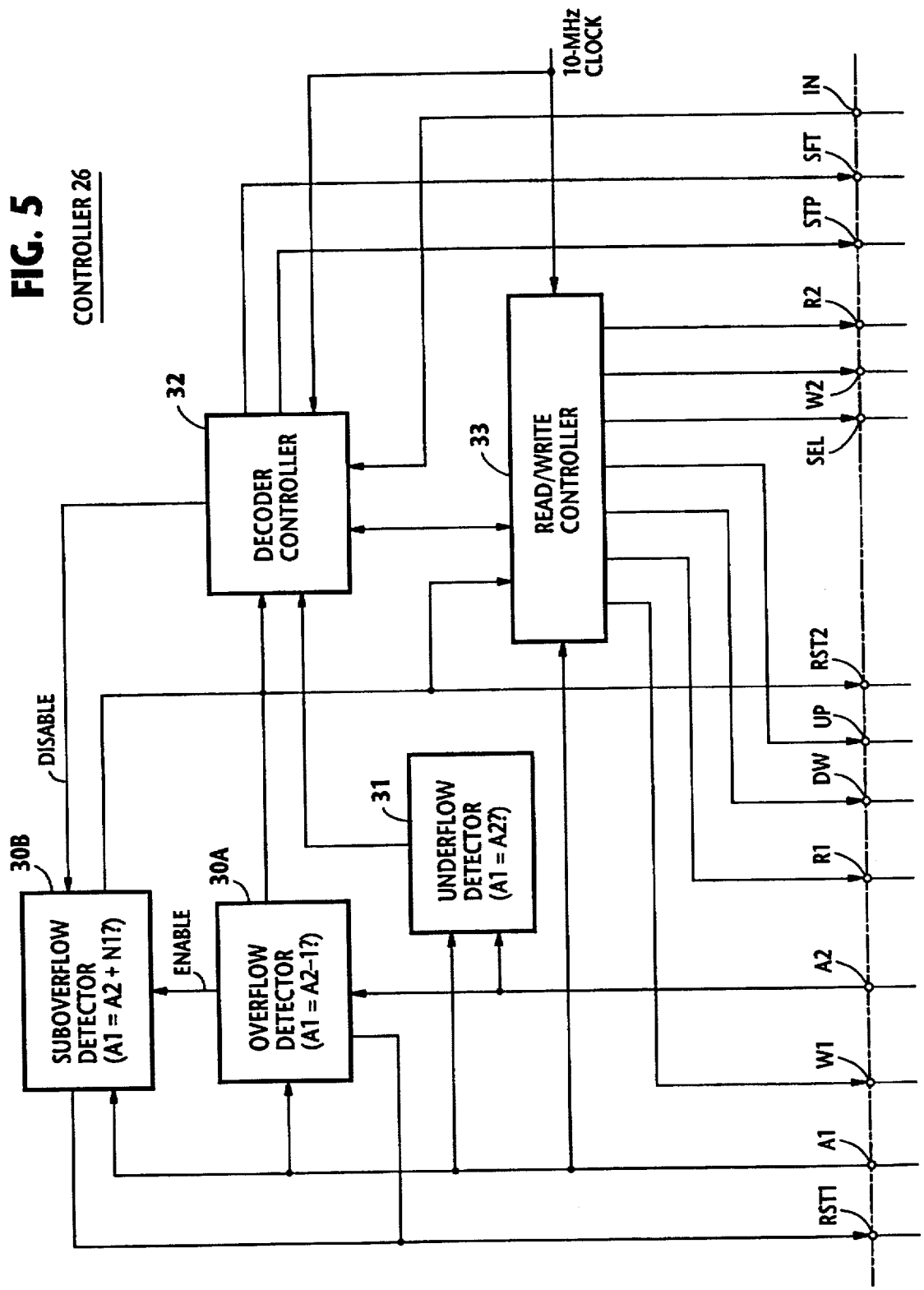

OVERFLOW

SUBOVERFLOW

SEQUENTIAL DECODER HAVING SHORT SYNCHRONIZATION RECOVERY TIME

RELATED APPLICATION

This is a continuation of application Ser. No. 07/737,547 filed Jul. 30, 1991, now abandoned, which is a CIP of application No. 07/229,416 filed Aug. 8, 1988, now abandoned.

BACKGROUND OF THE INVENTION

The present invention relates generally to a sequential decoder for decoding convolutional codes.

In order to detect errors in transmitted data bits and correct the data bits in error, the current practice involves segmenting data to be transmitted into several information symbols and converting them into convolutionally coded symbols using a forward error correction encoder and decoding transmitted symbols by an error correction decoder according to an algorithm which is known as the Fano algorithm.

According to the Fano algorithm developed by R. M. Fano and described in IEEE Transactions on Information Theory, IT-9 (1963), pages 64–74, the error correction encoder is provided with a state holding circuit and a function generator. The state holding circuit is typically composed of a shift register which retains its internal state but changes its state when it receives an information symbol. The function generator receives the internal state of the shift register to generate a coded symbol. The signal received by the decoder for hard-decision decoding does not necessarily match what is actually transmitted due to lost data bits or corruption of data bits during transmission or due to indefiniteness present in the amplitude levels of demodulated QAM or PSK signals resulting from phase errors introduced to the recovered carrier.

If the decoder performs its decoding step on a per symbol basis, the decoder can be said to have the same circuit function as the error correction encoder, or a "replica of the encoder". On receiving a coded symbol, the decoder compares it with each possible coded signal produced by the encoder replica if it was to receive each possible information symbol, and assumes a coded symbol as transmitted that is nearest to the received symbol. The yardstick which is currently employed for measuring the distance to the nearest coded symbol is the Fano likelihood. According to the Fano algorithm, an information symbol sequence which gives the largest cumulative value is assumed to be the most likely message sequence.

Should a large number of transmission errors occur, the decoder is likely to make a false decision and the discrepancies caused by the differences between the internal states of the encoder replica and those in the encoder grow much more rapidly than would be the case if the decoder were following the correct path. All subsequent attempts would therefore fail to find symbols having a large Fano likelihood value, thus making it possible to detect that a false decision has been made in the past. On detecting a false decision, the decoder retraces its path to return the internal states of the encoder replica to a point where the false decision was apparently made, selects an alternate path that gives the next largest cumulative value of the Fano likelihood and performs a decoding step on the selected path. If the decoder should fail in the search, it retraces further back to a past state to repeat the process. In this way, the decoder attempts to search for a correct path on the basis of trial and error. Since the past histories are retraced in the sequential decoder, the input and output symbols are stored in respective input and output buffers.

The error correction encoder and decoder mentioned above can be implemented by a circuit shown and described in U.S. Pat. No. 3,665,396 issued to George David Forney, Jr.

In order to provide comparison between the output symbols of the encoder replica and the input symbols to that replica, the decoder must be able to detect the boundary point of each codeword on which the comparison is performed. Stated otherwise, the comparison should be performed in synchronism with each received codeword. Since the received codeword does not usually contain timing information, such as sync codes, prior art sequential decoders perform the code resynchronization process on a trial and error basis.

Since out-of-word timing conditions can result in a situation which is equivalent to the occurrence of a serious transmission error, the decoding process encounters a substantial amount of delay, tending to overflow the input buffer. Such overflow conditions can therefore be taken as an indication of the occurrence of an out-of-word condition. On detecting a buffer overflow, the decoder shifts the codeword boundary timing backward by one bit interval before proceeding to perform decoding on a trial basis on a fresh symbol entered next into the input buffer. If this trial attempt still does not work to alleviate the overflow, the same process is repeated. Assume that each codeword is made up of n coded bits, there are n possible states which can be retraced to reestablish synchronism. Thus, a maximum of (n−1) trial attempts eventually enables the decoder to reestablish word synchronism. If the decoder should fail in advancing its decoding process further possibly due to irrecoverable transmission errors, the trial attempt for word synchronization by retracing or shifting the word boundary point is futile. In the worst case, a single trial attempt for word resynchronization will require the input buffer to store a maximum number of symbols that can be stored therein. The maximum amount of time taken to resynchronize the decoder is therefore (n−1) times the interval taken to store the maximum number of symbols into the input buffer. In addition, whole symbols stored in the input buffer must be discarded whenever a resynchronization is attempted.

Another important factor that influences the sequential decoding process is the well-known phase ambiguity of orthogonally modulated signals such as 4PSK (phase shift keyed) or 16 QAM (quadrature amplitude modulation) signals associated with the recovered carrier phase at the receiver. Thus, phase differences of an integral multiple of 90 degrees can occur in the case of 4PSK between the transmitted carrier and the recovered carrier. Since the orthogonal modulation employs a technique of alternately separating a bit sequence into two bit groups corresponding to in-phase (P) and quadrature-phase (Q) channels, respectively, the phase differences can result in bit reversals and transposition of channels.

SUMMARY OF THE INVENTION

It is therefore an object of the present invention to provide a receiver including a sequential decoder which resynchronizes with an incoming data stream in a shorter period of time than is attainable with prior art sequential decoders.

The sequential decoder of the present invention comprises first and second buffers, or random access memories, and a decoder coupled to the first and second buffers for decoding a symbol supplied from the buffers in synchronism with a clock pulse occurring at a rate higher than the transmission rate of the symbol. An address circuit is connected to the first and second buffers for writing the received convolutionally coded symbols into the first buffer at the transmission rate, reading symbols out of the first buffer into the decoder and writing symbols decoded by the decoder into the second buffer. A controller determines the likelihood of each symbol decoded by the decoder in accordance with a predetermined likelihood algorithm to cause the address circuit to read decoded symbols in a backward direction out of the second buffer into the decoder when the determination indicates a low likelihood value.

The controller detects an overflow condition of the first buffer when a predetermined number of locations of the first buffer are filled with received symbols. In response to the detection of the overflow condition, the controller causes the address circuit to read symbols out of the first buffer into the decoder starting with a symbol which is k symbols more recent than the symbol which is currently decoded so that those symbols between the currently decoded symbol and the newly selected symbol are skipped to move the decoding point to the selected symbol, where k is an integer smaller than the predetermined number. If one resetting operation does not work to alleviate the overflow condition, the above process is repeated a predetermined number of times. If the overflow condition recurs, the k-bit advancing is repeated and the word timing of the decoder is shifted by one clock interval. If the overflow condition occurs again, the k-bit advancing and the word-timing shift are repeated until the word timing is shifted a maximum of (n−1) clock intervals, where n is the number of coded bits in a symbol.

In a second aspect, a phase error introduced to a recovered carrier can be compensated for by a phase switching circuit which varies the logic level of the received symbols by an amount corresponding to a predetermined phase shift immediately following the detection of a buffer overflow. Specifically, the sequential decoder includes first and second buffers, a decoder coupled to the first and second buffers for receiving a symbol supplied from the first and second buffers and decoding the supplied symbol in synchronism with a clock pulse occurring at a rate higher than the transmission rate. The received convolutionally coded symbols are stored into the first buffer at the transmission rate, and symbols are read out of the first buffer into the decoder and symbols decoded by the decoder are stored into the second buffer.

The sequential decoder further includes an overflow detector that detects an overflow condition of the first buffer when it is filled with a first predetermined number of codewords and a suboverflow detector which is enabled in response to the detection of the overflow condition for detecting a suboverflow condition of the first buffer when it is filled with a second predetermined number of codewords less than the first predetermined number.

A controller determines the likelihood of each symbol decoded by the decoder in accordance with a predetermined likelihood algorithm to cause decoded symbols to be read out of the second buffer into the decoder in a backward direction when the determination indicates a low likelihood value. If a phase error occurs in the carrier recovery process, the overflow detector detects an overflow condition of the first buffer. In response, the controller causes the phase shifting circuit to vary the logic levels of each recovered codeword so that the recovered codewords are phase-shifted by a predetermined amount, and causes the first buffer to discard all previously stored codewords to allow the decoder to restart decoding the phase-shifted codewords. If the phase error is not sufficiently compensated for by this operation, the suboverflow detector detects a subflow condition of the first buffer, and in response, the controller causes the phase shifting circuit to introduce a further phase shift to the recovered codewords and causes the first buffer to discard all previously stored codewords to allow the decoder to restart decoding the further phase-shifted codewords. If a suboverflow condition is detected again, the phase shifting and codeword discarding process is repeated until the phase error is compensated.

BRIEF DESCRIPTION OF THE DRAWINGS

The present invention will be described in further detail with reference to the accompanying drawings, in which:

FIG. 5 is a schematic diagram of the controller of FIG. 4; and

DETAILED DESCRIPTION

Figure 1:
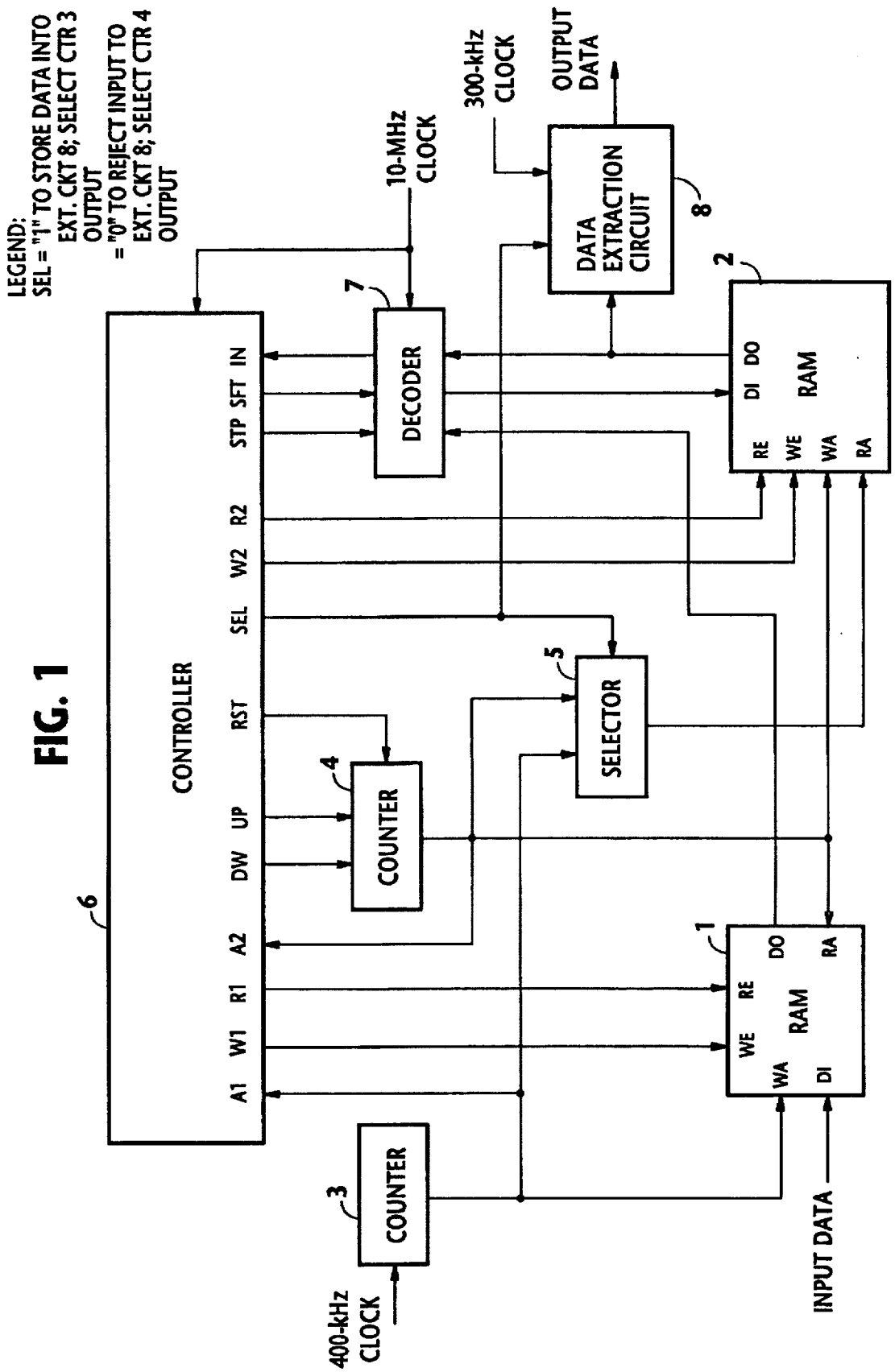
FIG. 1 is a block diagram of a sequential decoder according to a first preferred embodiment of the present invention.

Referring now to FIG. 1, there is shown a sequential decoder according to an embodiment of the present invention. Convolutional codes are modulated upon a carrier and transmitted from a transmitting site to a receiving site where the transmitted signal is fed into a demodulator, not shown, to recover the convolutional code symbols. For purposes of disclosure, it is assumed that the incoming symbol has a ¾ code rate. A clock recovery circuit, not shown, extracts clock timing from the demodulated signal and feeds it to a first $\log_2 M1$-bit address counter 3 which is clocked at 400 kHz to generate a first address signal A1. This address signal is supplied to a controller 6 through its terminal A1 and to an input buffer, or dual-port RAM 1 through its write address port WA.

The first address signal A1 is further applied to an address selector 5 to which a second address signal A2 is also supplied from a second $\log_2 M1$-bit address counter 4 that is driven at a rate of 10 MHz, for example, by a clock supplied from controller 6 through its down-count terminal DW or up-count terminal UP.

The demodulated incoming symbol bits are written into RAM 1 through its data input port DI at 400-kHz rate and stored in locations specified by the address signal A1 when RAM 1 is supplied to its write enable port WE with a write enable signal from the terminal W1 of controller 6.

Controller 6 examines the address signal A1 from counter 3 and supplies a read enable signal from its terminal R1 to the read enable port RE of RAM 1. Symbol bits stored in RAM 1 are read out of locations specified by the second address signal A2 that is supplied from counter 4 at 10-MHz rate to the read address port RA of RAM 1. The data read out of RAM 1 are supplied to a decoder 7 of known design, which is clocked at the same rate as counter 4.

Decoder 7 essentially comprises a bidirectional shift register and a plurality of exclusive-OR modulo-2 summers connected to some of the shift register stages in a configuration known as a "replica of the convolutional encoder." The shift register is normally shifted forward in response to the completion of a decoding process on input symbols from RAM 1.

The decoded symbols are supplied to the input terminal IN of controller 6 and further to the data input port DI of an output buffer, or dual-port RAM 2. Controller 6 supplies a write enable signal from its terminal W2 to the write enable port WE of RAM 2 to write the decoded data into locations specified by the address signal A2 which is supplied at the rate of 10 MHz from counter 4 to the write address port WA of the RAM 2.

Address selector 5 responds to a switching signal from terminal SEL of controller 6 by selecting one of address signals A1 and A2. When the switching signal is at logic 1, the first address signal A1 from counter 3 is selected, and when it is at logic 0, the second address signal A2 from counter 4 is selected. The selected address signal is applied to the read address port RA of RAM 2. When the switching signal at terminal SEL is at logic 1, the output of low-speed counter 3 is applied through selector 5 to the read address port RA of RAM 2 and decoded symbols are read out of RAM 2 into a data extraction circuit 8 at the rate of 400 kHz. The switching signal from controller 6 is also applied to data extraction circuit 8. When the switching signal is at logic 1, it causes extraction circuit 8 to latch decoded symbols from RAM 2. Since the decoded symbols contain parity bits, the latter is discarded from the latched symbols by the data extraction circuit and the remaining information bits are read out of extraction circuit 8 at a rate of 300-kHz into an external circuit.

Figure 2:
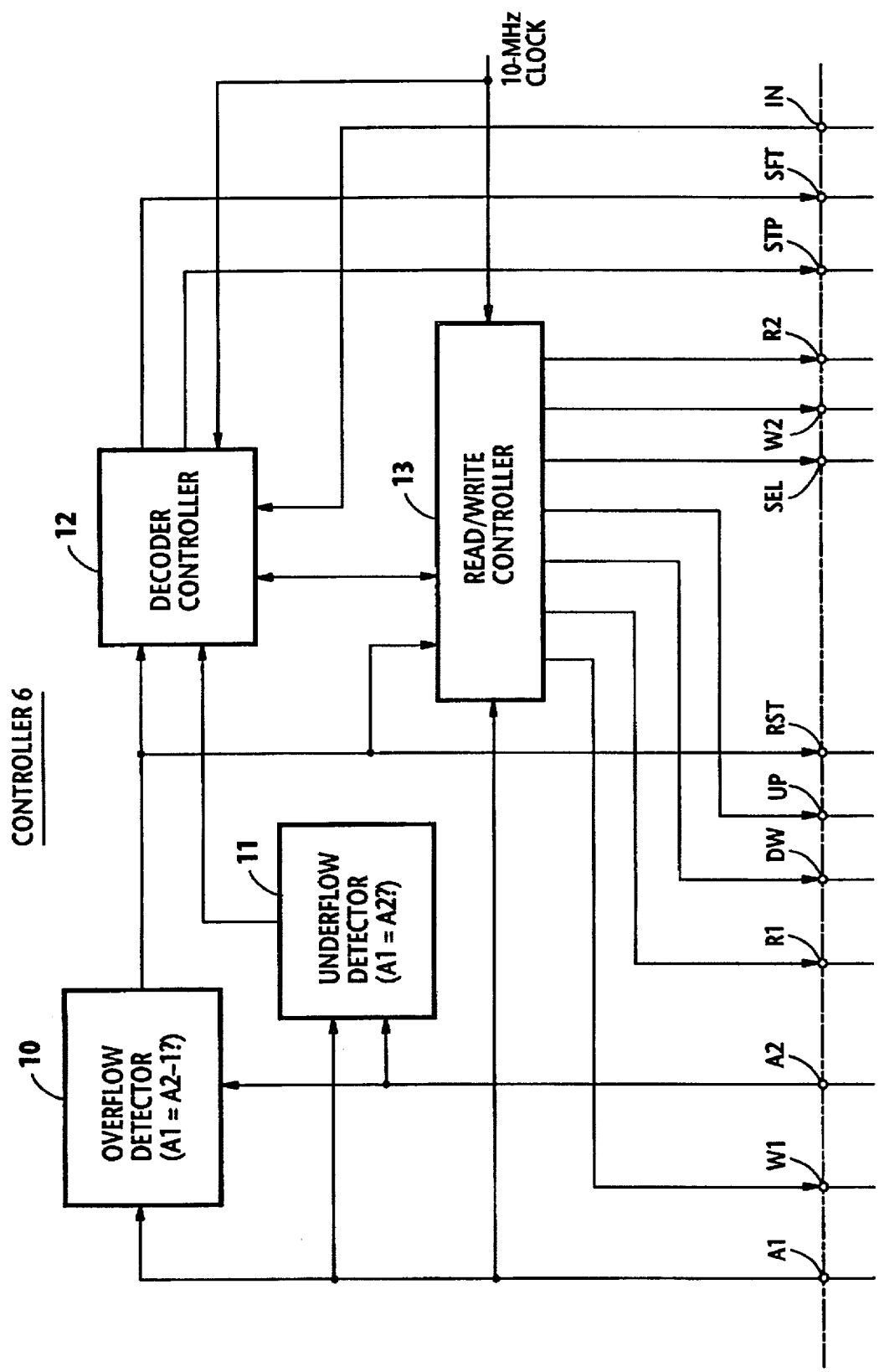
FIG. 2 is a schematic block diagram of the controller of FIG. 1.

As shown in FIG. 2, controller 6 comprises an overflow detector 10 which detects when RAM 1 is overflowed and supplies a reset signal from terminal RST to address counter 4 if the address count A1 is equal to A2−1. An underflow detector 11 is provided to detect when the address count RAM 1 is underflowed, namely, when A1 is equal to A2. A decoder controller 12, which performs the Fano algorithm at 10-MHz clock rate, receives the outputs of detectors 10 and 11 as well as decoded symbols from decoder 7 and supplies decoder control signals including forward/backward shift command signals and a stop command signal. A read/write controller 13, which is driven at 10-MHZ clock rate, is associated with decoder controller 12 and counter 3 to supply read/write control signals including the switching signal to terminal SEL, high-speed clock to terminals UP and DW, and read/write enable signals to terminals R1, R2, W1 and W2.

The operation of the sequential decoder of the invention is as follows. In response to the receipt of a fresh symbol bit, address counter 3 is incremented by a corresponding clock pulse, providing a count value A1 to read/write controller 13 through terminal A1. Read/write controller 13 applies a logic-1 switching signal to terminal SEL to cause selector 5 to supply the address count A1 to RAM 2. In addition, it supplies a write enable pulse through terminal W1 to RAM 1 and a read enable pulse through terminal R2 to RAM 2. Therefore, the fresh symbol bit is stored into a location of RAM 1 specified by address signal A1 and a decoded symbol is read out of a location of RAM 2 specified by address signal A1 for delivery to data extraction circuit 8. In response to the next fresh symbol, the above process is repeated. Read/write controller 13 supplies a clock pulse through up count terminal UP to counter 4 and supplies a read enable signal through R1 terminal to RAM 1 to read the next symbol from a location of RAM 1 addressed by the incremented address A2 and the read/write controller 13 communicates this fact to decoder controller 12. Decoder controller 12 applies a forward shift command through terminal SFT to decoder 7 to cause it to proceed with decoding the symbol just read out of RAM 1. The process is repeated so that fresh symbols are stored into RAM 1 and decoded symbols are read out of RAM 2 into data extraction circuit 8.

While the write operation of RAM 1 and the read operation of RAM 2 proceed in a manner just described, read/write controller 13 supplies 10-MHz clock pulses through terminal UP to counter 4 and a logic-0 switching signal to selector 5 to apply the high-speed address count A2 to RAMs 1 and 2. Read/write controller 13 further supplies a read enable pulse through terminal R1 to RAM 1 and a write enable pulse through terminal W2 to RAM 2. These read and write enable pulses are interleaved with the write and read enable pulses supplied through terminals W1 and R2. In this way, nondecoded symbols are read out of RAM 1 into decoder 7 and decoded symbols are supplied to RAM 2 at 10-MHZ rate on a time-shared basis with the write and read operations of RAMs 1 and 2 at 400-kHz rate.

On completion of a decoding process on each symbol, two input signals are supplied from decoder 7 to controller 6 through terminal IN. One of these signals represents a decoded symbol, the other represents a corresponding non-decoded symbol. These symbols are compared with each other by controller 6 using the Fano algorithm to determine the Fano likelihood value and hence the distance to the maximum likelihood path. As a result of the Fano algorithm decision, controller 6 supplies shift and stop command signals to decoder 7 via terminals SFT and STP, respectively.

If a large number of transmission errors occur, decoder 7 is likely to make a false decision and the discrepancies between the internal states of the encoder replica and those in the encoder grow much more rapidly than would be the case if the decoder were following the correct path. All subsequent attempts would therefore fail to find symbols having a large Fano likelihood value, thus making it possible to detect that a false decision has been made in the past. On detecting a false decision, controller 6 causes decoder 7 to retrace its path to return the internal states of the encoder replica to a point where the false decision was made and takes an alternate path that gives the next largest cumulative value of the Fano likelihood and performs a decoding step on the selected path.

More specifically, on detecting a false decision, controller 6 supplies a logic-0 switching signal to selector 5. The output of the high-speed counter 4 is supplied through selector 5 to the read address port RA of RAM 2 to read out decoded symbols into decoder 7. Decoder 7 repeats the decoding process by reading back past symbol bits from RAM 2. This is done by causing selector 5 to supply the address count A2 to RAM 2. In response to the logic-0 switching signal, data extraction circuit 8 prevents the decoded data from RAM 2 from being supplied to the external circuit.

Figure 3B:
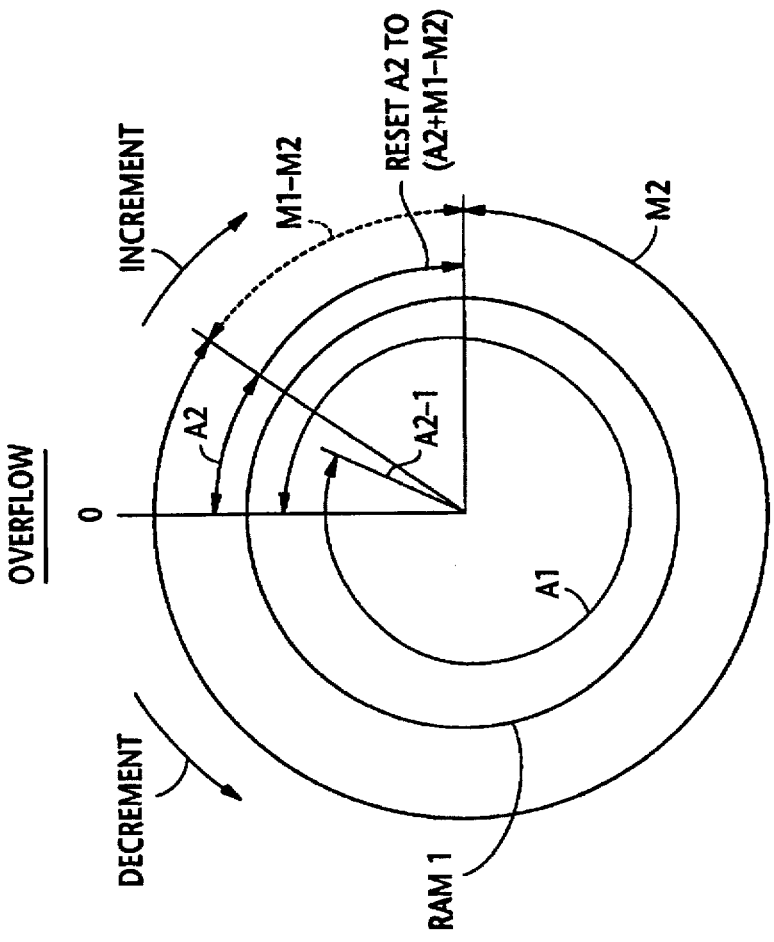
FIGS. 3a and 3b are illustrations of the read and write address counts of a random access memory of FIG. 1 under normal and overflow conditions, respectively.
Figure 3A:
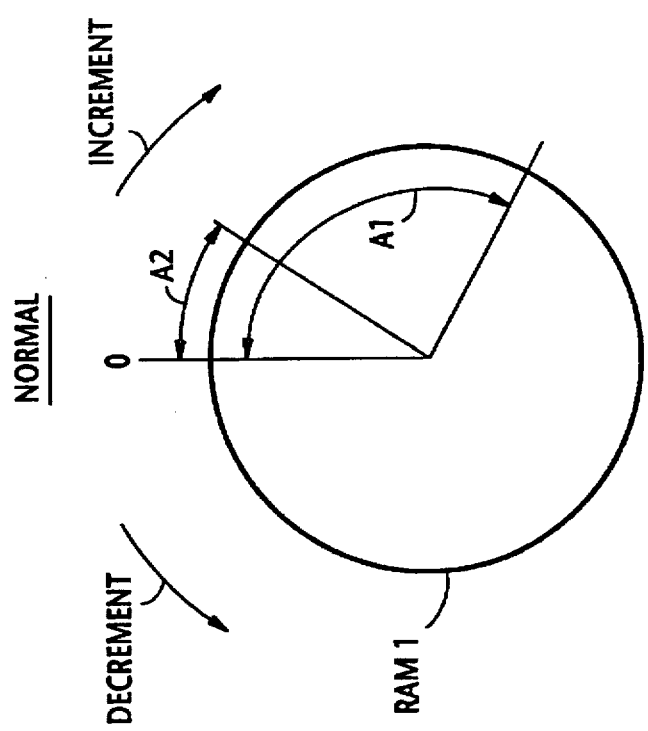

Since the decoding rate is much higher than the rate at which the incoming symbols are received, address signal A2 will be incremented to such a point approaching address signal A1 if there is no transmission error (see FIG. 3a). Under such conditions decoder 7 performs decoding on each fresh symbol as soon as it is stored into RAM 1. If such normal conditions prevail, no symbols will eventually be left in RAM 1 which are waiting to be decoded and an underflow condition is likely to occur. This underflow condition is detected by underflow detector 11 when address counts A1 and A2 become equal to each other. On detecting this condition, underflow detector 11 communicates this fact to decoder controller 12 to cause it to supply a stop command signal through terminal STP to decoder 7.

If a serious burst error occurs in the emission path or the codeword timing (i.e., the codeword timing or boundary point of each codeword of the decoder skips and an out-of-word timing condition occurs), a substantial amount of delay will be introduced to the decoding process performed on symbols in RAM 2, and RAM 1 will be overflowed and some of the previous symbol bits will be overwritten with newly arriving symbol bits. When such condition is approaching, overflow detector 10 produces an output and it is determined that not only the decoded symbols in RAM 2 but also some (k bits) of the nondecoded symbols in RAM 1 have been corrupted by irrecoverable errors, and the value of the address signal A2 will be incremented to approach the value of the address signal A1 as shown in FIG. 3b. Specifically, when address count A1 becomes equal to a count "A2−1" (which corresponds to a situation in which there is a difference of only one node in the code tree between the symbol just read out of RAM 1 into decoder 7 and a fresh symbol just written into RAM 1), overflow detector 10 generates a reset signal through terminal RST to counter 4 to reset its count from A2 to A2+(M1−M2).

In response to the reset signal from overflow detector 10, read/write controller 13 applies the 10-MHz clock to terminal UP, a read enable pulse to RAM1 through terminal R1 and a write enable pulse to RAM2 through terminal W2. In addition, it further applies a logic-0 switching signal to terminal SEL. As a result, counter 4 increments address count A2 of counter 4 by a count value k to move the decoding point address by k bits so that the decoder 7 restarts decoding on symbol bits received from RAM 1 more recently than the skipped k bits. If burst errors are the sole cause of the overflow condition and they occurred in no more than the skipped bits, the decoding proceeds properly on symbols received from RAM 1 more recently than the skipped bits and the overflow ceases to exist. After skipping the k bits, controller 12 examines the output of the overflow detector 10 to determine whether the overflow condition still exists.

If more than k bits have been corrupted by irrecoverable burst errors, the overflow condition still exists. If the overflow condition recurs, the above skipping and checking process is repeated a predetermined number of times. Therefore, the decoding point address is advanced by another k bits to check to see if this alleviates the overflow.

Since the prior art system provides resynchronization by resetting count A2 to count A1, the time interval elapsed from the resetting of count A2 to the next occurrence of overflow of RAM 1 is equal to M1 times the clock interval, where M1 is the memory capacity of RAM 1. In the present invention, this time interval is equal to (M1−M2) times the clock interval. Therefore, the present invention reduces the maximum amount of time taken to reestablish code synchronization by a factor of (M1−M2)/M1 and the number of codewords which must be discarded during a resynchronization process is reduced to M1−M2−1.

If the out-of-word timing error is the cause of the overflow, the decoder 7 will resume normal decoding operation by shifting the word timing by one bit interval at a time and repeat this shifting a maximum of three times since the code rate of the signal is assumed to be ¾.

At this time, the decoding point address is advanced again by k bits and the word timing of the decoder 7 is shifted one clock interval by commanding it via terminal SFT and enabling it to restart decoding at the shifted clock timing on the symbol bits read out of RAM 1. The controller 12 then checks to see if the overflow condition is detected again. If so, the above k-bit advancing and one-clock interval shifting operation is repeated until the word timing is shifted a maximum of (n−1) clock intervals, where n is the number of coded bits in a codeword (i.e., 4 in the ¾ code rate). If the overflow condition still exists, there is a possibility that the symbol bits on which the decoding was just performed have been corrupted by burst errors and similarly corrupted symbol bits still exist in RAM 1 waiting to be decoded. For this reason, the controller 12 again performs the check for burst errors by utilizing the above-described advancing and checking operation.

If the overflow condition is still detected, it is determined that the carrier phase timing is in error and all the symbol bits in RAM 1 have been irrecoverably corrupted.

Figure 4:
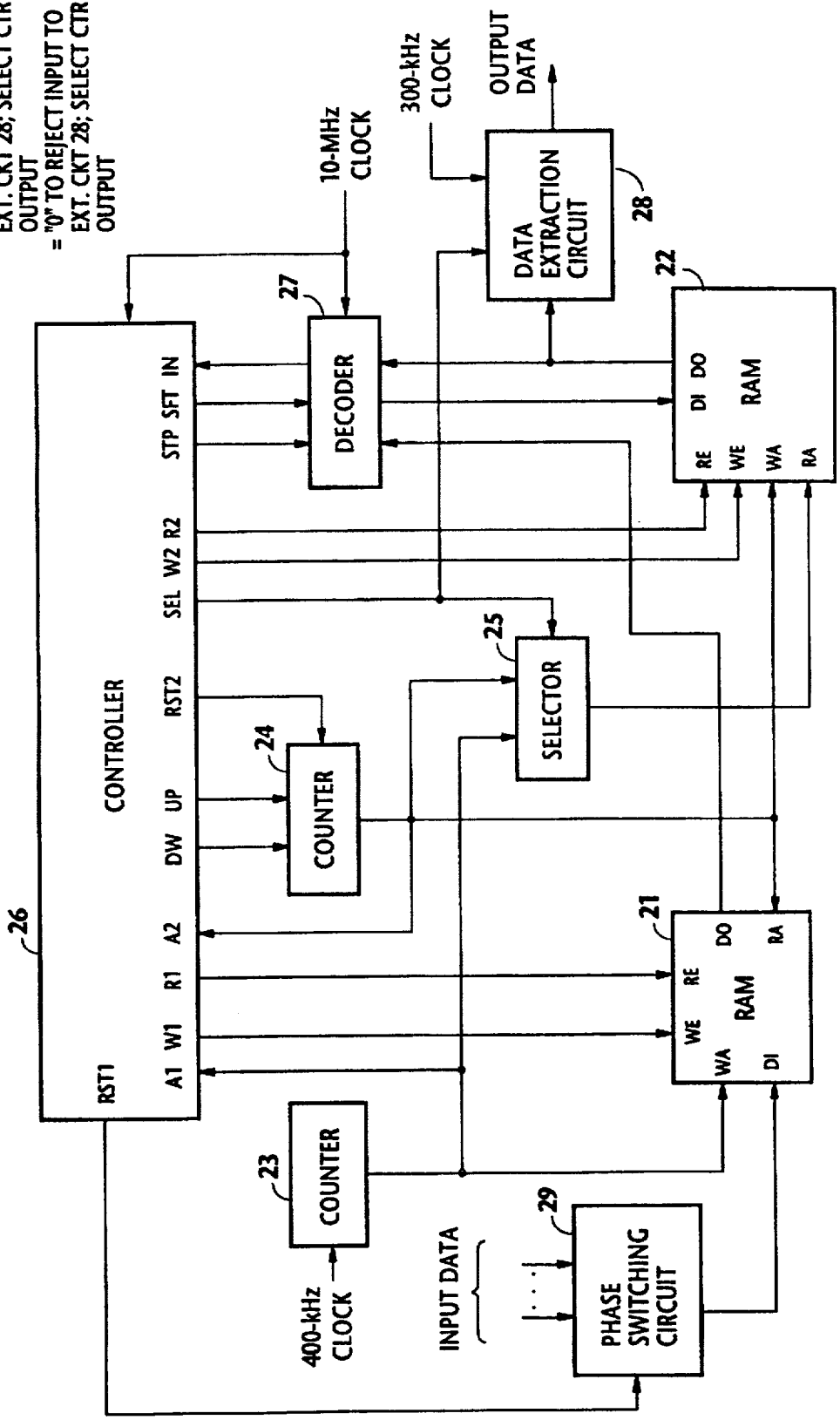
FIG. 4 is a block diagram of a sequential decoder according to a second preferred embodiment of the present invention.

To overcome the out-of-phase error, a modified embodiment of the present invention is shown in FIG. 4. In this modification, 4-bit/symbol convolutional codes are transmitted on a 16QAM (quadrature amplitude modulation) system having a ¾ code rate. Received modulated codes are demodulated by a 16-QAM demodulator into a pair of in-phase (P-channel) and quadrature (Q-channel) signals each having one of four different amplitude levels which correspond respectively to the four phases on each axis of the phasor diagram. Each of these signals is converted to a two-bit signal by comparison with hard-decision thresholds in a well known manner by an analog-to-digital converter, not shown. The two-bit I and Q signals, which comprise a symbol, are supplied as Dpl and Dql to a phase switching circuit 29 in which the symbol's logic state is converted in such a manner that a phase error introduced to the recovered carrier is compensated. The conversion of one logic state to another is a quantum step corresponding to a phase shift of 90 degrees. Thus, successive logic state conversions result in phase shifts of 90, 180 and 270 degrees with respect to the incoming symbol. The two-bit outputs of phase switching circuit 29 are combined into a 4-bit output and fed to a RAM 21 for storing a maximum of N 4-bit symbols. Each 4-bit symbol is written into a storage location of RAM 21 specified by an address signal A1 supplied from a $\log_2$M1-bit address counter 23. As in the previous embodiment, address counter 23 is incremented in response to each of the recovered clock pulses at 400-kHz. Stored 4-bit symbols are read out of RAM 21 into a decoder 27 in response to address signal A2 supplied from a $\log_2$M1-bit address counter 24 which is incremented or decremented by the 10-MHz clock from terminals UP and DW of a controller 26. Similar to FIG. 1, the data output DO of RAM 22 is coupled to a data extraction circuit 28 in which the decoded symbols are latched in response to a logic-1 switching signal from controller 26 through terminal SEL. After discarding parity bits, the decoded symbols are clocked out at 300-kHz rate for delivery to an external circuit.

To control the read/write modes of RAMs 21 and 22, controller 26 receives a signal through terminal A1 to control the read/write timing of RAMs 21 and 22 in a manner similar to FIG. 1.

As shown in FIG. 5, controller 26 is generally similar to the controller 6 of FIG. 2 with the exception that it further includes a suboverflow detector 30B in addition to the overflow detector 30A which is similar to overflow detector 10 of FIG. 2. Underflow detector 31, decoder controller 32 and read/write controller 33 correspond respectively in significance to those marked 11, 12 and 13 in FIG. 2.

Overflow detector 30A detects when address signal A1 is equal to A2−1 to supply a first reset signal through reset terminal RST1 to phase switching circuit 29 and a second reset signal to counter 24 through reset terminal RST2. The first reset signal causes the phase switching circuit 29 to advance the logic states of the binary quadrature signals by 90 degrees with respect to the incoming symbols (i.e., by an amount corresponding to a phase shift of 90 degrees). The second reset signal is to reset address count A2 equal to address count A1. Overflow detector 30A further supplies an enable signal to suboverflow detector 30B when it detects a suboverflow condition in RAM 21. When enabled, suboverflow detector 30B proceeds to detect if a "suboverflow" condition occurs in RAM 21, i.e., RAM 21 is filled with symbols smaller than its storage capacity. This "suboverflow" condition corresponds to a situation that occurs when count A1 becomes equal to A2+N1 (where N1 is typically 1/10 of the number of address locations M1 of RAM 21). Suboverflow detector 30B generates the first and second reset signals in a manner identical to those generated by the overflow detector 30A. Decoder controller 32 responds to the second reset signals from detectors 30A and 30B to initiate counting symbols which have been decoded by decoder 27 and disables the suboverflow detector 30B when the count reaches N2 which is much smaller than Mi.

Figure 6A:
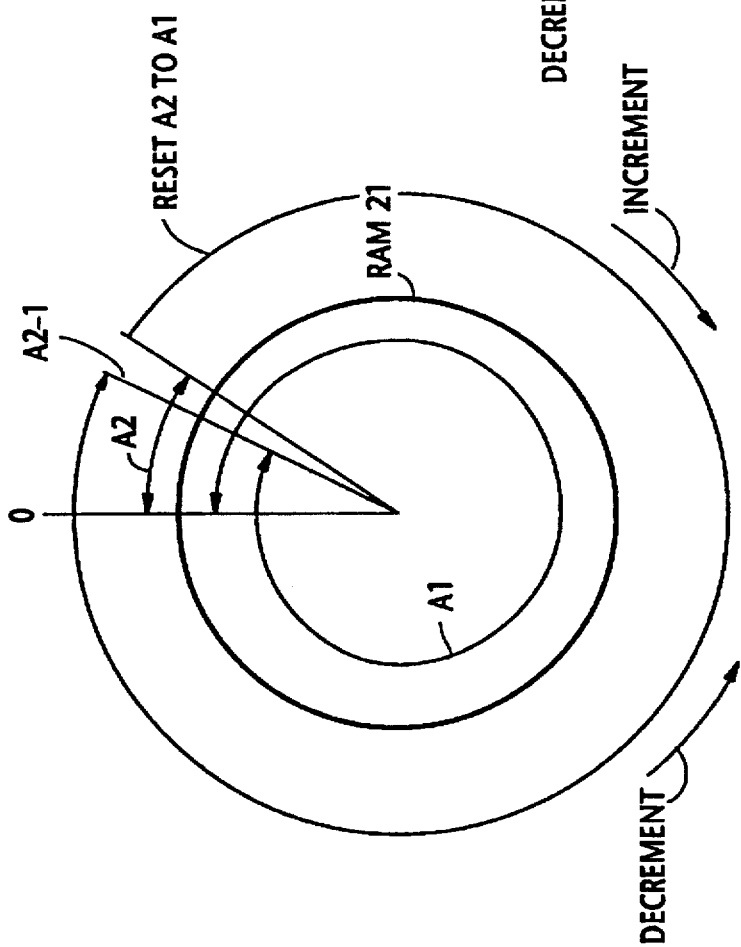
FIGS. 6a and 6b are illustrations of the read and write address counts of a random access memory of FIG. 4 under an initial overflow condition and a subsequent "suboverflow" condition, respectively.
Figure 6B:
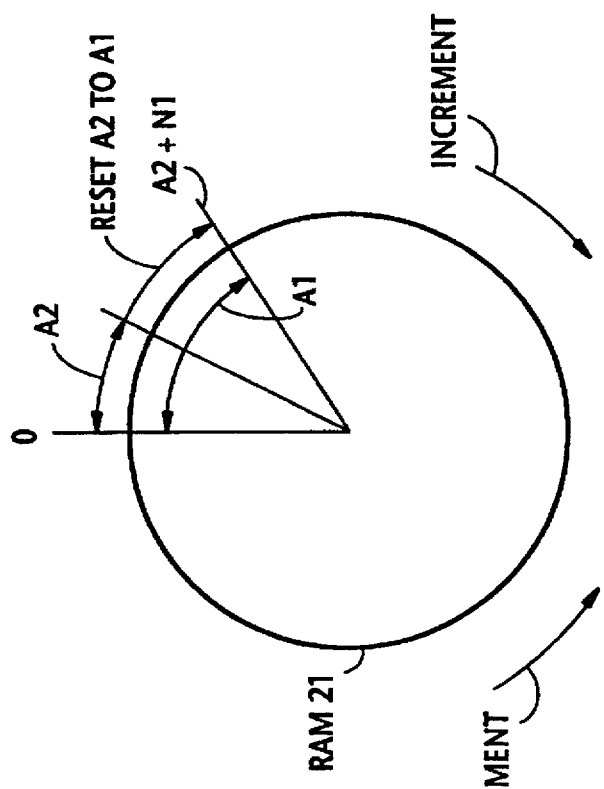

Therefore, if an overflow condition occurs in RAM 21 as a result of phase errors introduced to the reference carrier, the address count A1 becomes equal to A2−1 and the overflow detector 30A of controller 26 detects this condition and supplies a first reset signal through terminal RST1 to the phase switching circuit 29. The logic state of one or both of the incoming two-bit signals Dp1 and Dq1 is converted so that the 4-bit output symbol is advanced by 90 degrees with respect to the incoming symbol. The reset logic states are maintained until they are reset again. Simultaneously with the resetting of phase switching circuit 29, a second reset signal is supplied from the overflow detector 30A through terminal RST2 to the address counter 24 to reset its count equal to the address count A1 of counter 23 (FIG. 6a). If these resetting operations do not work to alleviate the situation, RAM 21 will be again filled with a growing number of unprocessed symbols. Since the suboverflow detector 30B is enabled by the overflow detector 30A, a 'suboverflow' condition will be detected when A1 becomes equal to A2+N1 (see FIG. 6b). The phase switching circuit 29 is set to introduce another 90 degree phase shift to the incoming digital signals, giving a total of 180-degree phase shift, and the address counter 24 is again reset equal to A1. It will be seen that in the worst case the initial and subsequent resetting operations will be performed a total of three times to correct phase errors. If the initial or subsequent resetting operations do not work to alleviate the phase error situation, the number of successfully decoded symbols will increase. However, decoder controller 32 will judge that the phase error has been corrected as it counts a preselected number (=N2) of validly decoded symbols and it derives a high likelihood value from the Fano algorithm decision and supplies a disable signal to suboverflow detector 30B.

The foregoing description shows only preferred embodiments of the present invention.

Various modifications are apparent to those skilled in the art without departing from the scope of the present invention which is only limited by the appended claims. Therefore, the embodiments shown and described are only illustrative, not restrictive.

What is claimed is:

1. A sequential decoder for decoding convolutionally coded symbols received at a transmission rate of the symbols, comprising:

first and second buffer storage means;

a decoder coupled to said first and second buffer means for receiving a symbol supplied from said first and second storage means and for decoding the supplied symbol in synchronism with a clock pulse occurring at a rate higher than said transmission rate;

address means for storing the received convolutionally coded symbols into said first storage buffer means at said transmission rate, reading symbols out of said first buffer storage means into said decoder and storing symbols decoded by said decoder into said second buffer storage means; and control means, connected to said first buffer storage means, said decoder means, and said address means, for determining the likelihood of each symbol decoded by said decoder in accordance with a predetermined likelihood algorithm; causing said address means to read decoded symbols in a backward direction out of said second buffer storage means into said decoder when the determination indicates a low likelihood; and for detecting an overflow condition of said first buffer storage means when a predetermined number of locations thereof are filled with the received symbols and causing said address means to read symbols out of said first buffer storage means into said decoder starting with a symbol which is k symbols older than the most recently received symbol, where k is an integer smaller than said predetermined number, said control means causing said decoder to repeatedly perform decoding, upon detection of a said overflow condition, on a symbol which is shifted backward by one clock interval with respect to a previous symbol.

2. A sequential decoder as claimed in claim 1, wherein said address means comprises:

a first address counter for incrementing a first address count in response to receipt of each of said convolutionally coded symbols and storing each of the received coded symbols into said first buffer storage means in accordance with said first address count; and a second address counter for varying a second address count in response to a control signal from said control means and reading symbols out of said first buffer storage means in accordance with said second address count, said control means including means for generating said control signal for incrementing said second address count when said determination indicates a high likelihood value and decrementing said second address count when said determination indicates a low likelihood value, said control means being responsive to the detection of said overflow condition for resetting said second address counter equal to a value corresponding to a location of said first buffer storage means which is shifted k symbols backwards from the location of the most recently received symbol.

3. In a transmission wherein convolutionally coded symbols are quadrature amplitude modulated upon a carrier and transmitted to a receive site where the carrier is demodulated to recover the convolutionally coded symbols, a sequential decoder for decoding the recovered convolutionally coded symbols, said demodulated convolutionally coded symbols having quadriphase ambiguities with respect to a reference phase, comprising:

first and second buffer storage means;

a decoder coupled to said first and second buffer storage means for receiving a symbol supplied from said first and second buffer storage means and decoding the supplied symbol in synchronism with a clock pulse occurring at a rate higher than said transmission rate;

first address means for supplying a first address value to said first buffer storage means at a transmission rate of the recovered symbols and storing the recovered symbols into said first buffer storage means;

second address means for supplying a second address value to said first and second buffer storage means at a rate higher than said transmission rate and reading symbols out of said first buffer storage means into said decoder and storing symbols decoded by said decoder into said second buffer storage means; and control means, connected to said first buffer storage means, said decoder means, and said address means, for determining the likelihood of each symbol decoded by said decoder in accordance with a predetermined likelihood algorithm; causing said second address means to read decoded symbols in a backward direction out of said second buffer storage means into said decoder when the determination indicates a low likelihood value; and detecting an overflow condition of said first buffer storage means when a first predetermined number of locations thereof are filled with the received symbols, resetting the second address value of said second address means to the first address value of said first address means, varying logic levels of said recovered symbols by an amount corresponding to a predetermined amount of phase shift, detecting a suboverflow condition of said first buffer storage means when a second predetermined number of locations thereof are filled with the received symbols after said logic levels are varied, resetting the second address value to said first address value, and varying the logic levels of said recovered symbols by an amount corresponding to a predetermined amount of phase shift in response to the detection of said suboverflow condition, said second predetermined number being smaller than said first predetermined number.

4. A sequential decoder as claimed in claim 3, wherein said predetermined phase shift corresponds to a submultiple of 360 degrees.

5. A sequential decoder as claimed in claim 3, wherein said control means further includes means for counting symbols validly decoded by said decoder to produce a count value and for disabling the detecting of said suboverflow condition when the count value reaches a third predetermined number smaller than said first predetermined number.

6. In a transmission system wherein convolutionally coded symbols are quadrature amplitude modulated upon a carrier and transmitted to a receive site where the carrier is demodulated to recover the convolutionally coded symbols, a sequential decoder for decoding the recovered convolutionally coded symbols, said demodulated convolutionally coded symbols having quadriphase ambiguities with respect to a reference phase, said sequential decoder comprising:

first and second buffer storage means;

a decoder coupled to said first and second buffer storage means for receiving a symbol supplied from said first and second buffer storage means and decoding the supplied symbol in synchronism with a clock pulse occurring at a rate higher than said transmission rate;

first address means for supplying a first address value incremented in response to a transmission rate of said recovered symbols and storing the recovered symbols into said first buffer storage means; and second address means for supplying a second address value incremented at a rate higher than said transmission rate to said first and second buffer storage means and reading symbols out of said first buffer storage means into said decoder and storing symbols decoded by said decoder into said second buffer storage means;

a method comprising the steps of:
 (a) determining the likelihood of each symbol decoded by said decoder in accordance with a predetermined likelihood algorithm;
 (b) causing said second address means to read decoded symbols in a backward direction out of said second buffer storage means into said decoder when the determination indicates a low likelihood value;
 (c) detecting an overflow condition of said first buffer storage means when a first predetermined number of locations thereof are filled with the received symbols;
 (d) resetting the second address value of said second address means to the first address value of said first address means;
 (e) varying logic levels of said received symbols by an amount corresponding to a predetermined amount of phase shift;
 (f) detecting a suboverflow condition of said first buffer storage means when a second predetermined number of locations thereof are filled with the received symbols, said second predetermined number being smaller than said first predetermined number; and
 (g) repeating the steps (d) and (e) when said suboverflow condition is detected.

7. A method as claimed in claim 6, further comprising the steps of counting symbols validity decoded by said decoder to produce a count value, following the step (g) and repeating the step (f) until the count value reaches a third predetermined number smaller than said first predetermined number.

8. A method for sequentially decoding convolutionally coded symbols, said convolutionally coded symbols having quadriphase ambiguities with respect to a reference phase, comprising the steps of:
 (a) determining the likelihood of each symbol in accordance with a predetermined likelihood algorithm;
 (b) providing a buffer storage means;
 (c) storing symbols in said buffer storage means;
 (d) causing reading of symbols in a backward direction out of said buffer storage means into a decoder when the determination indicates a low likelihood value;
 (e) providing another buffer storage means for storing symbols;
 (f) detecting an overflow condition of said another buffer storage means when a first predetermined number of locations thereof are filled with the received symbols;
 (g) setting an address value of a memory location to be read in said buffer storage means to the address value read in said another buffer storage means;
 (h) varying logic levels of said received symbols by an amount corresponding to a predetermined amount of phase shift;
 (i) detecting a suboverflow condition of said another buffer storage means when a second predetermined number of locations thereof are filled with the received symbols, said second predetermined number being smaller than said first predetermined number; and
 (j) repeating the steps (g) and (h) when said suboverflow condition is detected.

9. A method as claimed in claim 8, further comprising the steps of counting symbols validity decoded by said decoder to produce a count value, following the step (j) and repeating the step (i) until the count value reaches a third predetermined number smaller than said first predetermined number.

10. A method for sequentially decoding convolutionally coded symbols, comprising the steps of:

(a) receiving the symbols at a transmission rate;

(b) incrementing a first address value at the same rate as the transmission rate;

(c) incrementing a second address value at a rate higher than the transmission rate;

(d) storing the received symbols in a first memory at an address determined by the first address value;

(e) reading symbols out of the first memory from an address determined by the second address value, and into a decoder;

(f) processing through the decoder, the symbols read out of the first memory at a pulse rate higher than said transmission rate, and thereby producing decoded symbols;

(g) storing the decoded symbols in a second memory at an address determined by the second address value;

(h) for each decoded symbol, calculating the likelihood of receiving the decoded symbol in accordance with a predetermined likelihood algorithm;

(i) reading the decoded symbol out of the second memory and through the decoder in a backward direction when the likelihood of the decoded symbol is calculated to be below a predetermined lower limit;

(j) declaring an overflow condition for the first memory when a first predetermined number of locations thereof are filled with the received symbols;

(k) resetting the second address value to the first address value;

(l) varying logic levels of the received symbols by an amount corresponding to a predetermined amount of phase shift;

(m) detecting a suboverflow condition for the first memory when a second predetermined number of locations thereof are filled with the received symbols, said second predetermined number being smaller than said first predetermined number; and (n) repeating steps (k) and (l) when the suboverflow condition is detected.

11. A method as claimed in claim 10, further comprising the steps of counting symbols validly decoded by said decoder and producing a count value thereby, and following step (n), repeating step (m) until the count value reaches a third predetermined number smaller than said first predetermined number.

12. A sequential decoder for decoding convolutional codewords, which have been orthogonally modulated on quadrature carriers and transmitted to a receive site where codewords are recovered, said recovered codewords having phase ambiguity with respect to a reference phase, said sequential decoder comprising:

phase shifting means for varying logic levels of each of said recovered codewords by an amount corresponding to a predetermined phase to skill each of said recovered codewords to respectively produce first phase-shifted codewords;

a first buffer for storing said first phase-shifted codewords from said phase shifting means;

a second buffer;

a decoder for decoding said first phase-shifted codewords supplied from said first buffer, wherein decoded codewords are stored in said second buffer;

an overflow detector for detecting an overflow condition of said first buffer when a first predetermined number of said first phase-shifted codewords are stored therein;

a suboverflow detector, arranged to be enabled in response to the detection of the overflow condition, for detecting a suboverflow condition of said first buffer when said first buffer is filled with a second predetermined number of said first phase-shifted codewords which is smaller than said first predetermined number; and control means for (a) determining a likelihood value of said decoded codewords in accordance with a predetermined likelihood algorithm, (b) for controlling said decoder to re-decode decoded codewords stored in said second buffer when the determination indicates a low likelihood value, (c) for supplying a command signal to said phase shifting means to phase-shift said recovered codewords, (d) for controlling said first buffer to discard all previously stored phase-shifted codewords and to store more recently phase-shifted codewords in response to the detection of the overflow condition to allow said decoder to restart decoding said more recently phase-shifted codewords, and (e) for supplying said command signal to said phase shifting means to further phase-shift said more recently phase-shifted codewords to generate further phase-shifted codewords and for controlling said first buffer to discard all previously stored more recently phase-shifted codewords in response to the detection of the suboverflow condition and to store said further phase-shifted codewords to allow said decoder to restart decoding said further phase-shifted codewords.

13. A method of decoding convolution codewords in a sequential decoder where In a said convolutional codewords are orthogonally modulated on quadrature carriers and transmitted to a receive site where codewords are recovered, said codewords having phase ambiguity with respect to a reference phase, wherein said sequential decoder comprises a first buffer for storing said recovered codewords, a second buffer; a decoder for decoding said recovered codewords supplied from said first buffer, an overflow detector for detecting an overflow condition of said first buffer when a first predetermined number of said recovered codewords are stored therein, and a suboverflow detector, arranged to be enabled in response to the detection of the overflow condition, for detecting a suboverflow condition of said first buffer when said first buffer is filled with a second predetermined number of said recovered codewords which is smaller than the first predetermined number, said method comprising the steps of:

decoding said recovered codewords stored in said first buffer to generate decoded codewords;

storing said decoded codewords in said second buffer;

determining a likelihood value of each of said decoded codewords in accordance with a predetermined likelihood algorithm;

re-decoding said decoded codewords stored in said second buffer when the determination indicates a low likelihood value;

varying logic levels of each of said recovered codewords, in response to an overflow condition detected by the overflow detector, by an amount corresponding to a predetermined phase so that said recovered codewords are phase shifted to produce phase-shifted codewords;

discarding from said first buffer all previously stored recovered codewords;

storing said phase-shifted codewords in said first buffer to allow said decoder to restart decoding said phase-shifted codewords;

varying logic levels of each said phase-shifted codewords, in response to a suboverflow condition detected by the suboverflow detector, by an amount corresponding to said predetermined phase so that said phase-shifted codewords are further phase shifted to produce further phase-shifted codewords;

discarding from said first buffer all previously stored phase-shifted codewords; and storing said further phase-shifted codewords to allow said decoder to restart decoding said further phase-shifted codewords.

* * * * *